(12) United States Patent
Choi et al.

(10) Patent No.: US 6,287,747 B1
(45) Date of Patent: Sep. 11, 2001

(54) PHOTOSENSITIVE POLYMER HAVING CYCLIC BACKBONE AND RESIST COMPOSITION COMPRISING THE SAME

(75) Inventors: Sang-jun Choi; Dong-won Jung, both of Seoul; Si-hyeung Lee, Suwon, all of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/465,926

(22) Filed: Dec. 17, 1999

(30) Foreign Application Priority Data

Dec. 24, 1998 (KR) .................................................. 98-58045

(51) Int. Cl.$^7$ ............................. G03F 7/039; C08F 24/00; C08F 136/20; C08F 232/08
(52) U.S. Cl. ...................... 430/270.1; 526/282; 526/309; 526/266
(58) Field of Search ..................................... 526/282, 309, 526/266; 430/270.1

(56) References Cited

U.S. PATENT DOCUMENTS

| | | | |
|---|---|---|---|
| 4,999,410 | * 3/1991 | Mathias et al. | 526/318.3 |
| 5,247,035 | * 9/1993 | Besecke et al. | 526/309 X |
| 5,354,895 | * 10/1994 | Besecke et al. | 560/155 |
| 6,080,524 | * 6/2000 | Choi et al. | 430/270.1 |

OTHER PUBLICATIONS

Grant et al, *Grant & Hackh's Chemical Dictionary,* 5th ed., McGraw–Hill Book Company, New York, NY, 1987, pp. 22, 290, 1987.*

Tsuda et al., *Macromolecules,* vol. 26, No. 16, Aug. 16, 1993, pp. 4734–4735, Aug. 1993.*

Tsuda et al, *Polymer,* vol. 35, No. 15, Jul. 1994, pp. 3317–3328.*

* cited by examiner

*Primary Examiner*—Cynthia Hamilton
(74) *Attorney, Agent, or Firm*—The Law Offices of Eugene M. Lee, PLLC

(57) ABSTRACT

A photosensitive polymer represented by the following formula, and a resist composition including (a) a photosensitive polymer represented by the following formula:

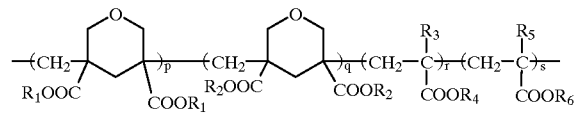

where $R_1$ is a $C_7$ to $C_{20}$ alicyclic aliphatic hydrocarbon, $R_2$ and $R_4$ independently represent $C_1$ to $C_7$ alicyclic aliphatic hydrocarbon, $R_3$ and $R_5$ independently represent hydrogen or methyl group, $R_6$ is hydrogen or 2-hydroxyethyl group, $p/(p+q+r+s)$ is from 0.1 to about 0.5, $q/(p+q+r+s)$ is from 0.1 to about 0.5, $r/(p+q+r+s)$ is from 0.0 to about 0.5, and $s/(p+q+r+s)$ is from 0.01 to about 0.5, and (b) a photoacid generator (PAG), are disclosed.

19 Claims, 3 Drawing Sheets

PHOTOSENSITIVE POLYMER HAVING CYCLIC BACKBONE AND RESIST COMPOSITION COMPRISING THE SAME

BACKGROUND OF THE INVENTION

1. Field of the Invention

The present invention relates to a chemically amplified resist composition and, more particularly, to a photosensitive polymer whose backbone has a cyclic structure and to a resist composition containing the photosensitive polymer for an ArF excimer laser.

2. Description of the Related Art

As semiconductor devices become highly integrated and complicated to fabricate, fine pattern formation is required. Further, as the capacity of a semiconductor device increases to exceed 1 giga bit, a pattern size having a design rule of less than 0.2 μm is required. Accordingly, there are limitations in using a conventional resist material with a KrF excimer laser (248 nm). Thus, a new resist material capable of being developed using an ArF excimer laser (193 nm) has been developed in a lithography process.

(Meth)acrylate polymers are generally used as the resist material in the lithography process using the ArF excimer laser. However, such polymers have very weak resistance to dry etching. Accordingly, to increase the resistance to dry etching, a polymer having a backbone composed of an alicyclic compound such as an isobornyl group, an adamantyl group or a tricyclodecanyl group, is used. However, the resulting resist still exhibits weak resistance to dry etching.

SUMMARY OF THE INVENTION

To solve the above problems, it is a feature of the present invention to provide a photosensitive polymer whose backbone has a cyclic structure and contains an alicyclic compound, for obtaining sufficiently strong resistance to dry etching.

It is another feature of the present invention to provide a resist composition containing the photosensitive polymer, suitable for use in a lithography process using an ArF excimer laser.

In accordance with the present invention, there is provided a photosensitive polymer represented by the following formula:

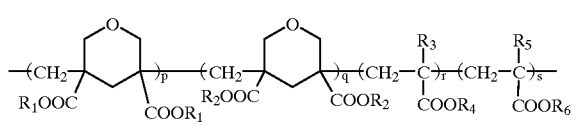

where $R_1$ is a $C_7$ to $C_{20}$ alicyclic hydrocarbon compound, $R_2$ and $R_4$ independently represent a $C_1$ to $C_7$ aliphatic hydrocarbon or alicyclic compound, $R_3$ and $R_5$ independently represent hydrogen or methyl group, $R_6$ is hydrogen or 2-hydroxyethyl group, $p/(p+q+r+s)$ is from 0.1 to about 0.5, $q/(p+q+r+s)$ is from 0.1 to about 0.5, $r/(p+q+r+s)$ is from 0.0 to about 0.5, and $s/(p+q+r+s)$ is from 0.01 to about 0.5, wherein $p+q+r+s=1.0$.

In accordance with an additional feature of the present invention, there is provided a resist composition comprising (a) a photosensitive polymer represented by the following formula:

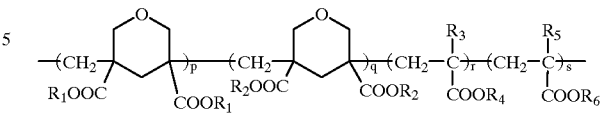

where $R_1$ is a $C_7$ to $C_{20}$ alicyclic hydrocarbon compound, $R_2$ and $R_4$ independently represent a $C_1$ to $C_7$ aliphatic hydrocarbon or alicyclic compound, $R_3$ and $R_5$ independently represent hydrogen or methyl group, R6 is hydrogen or 2-hydroxyethyl group, $p/(p+q+r+s)$ is from 0.1 to about 0.5, $q/(p+q+r+s)$ is from 0.1 to about 0.5, $r/(p+q+r+s)$ is from 0.0 to about 0.5, and $s/(p+q+r+s)$ is from 0.01 to about 0.5, wherein $p+q+r+s=1.0$, and (b) a photoacid generator (PAG).

These and other features of the present invention will be readily apparent to those skilled in the art upon review of the detailed description of preferred embodiments which follows.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF PREFERRED EMBODIMENTS

Figure 1:
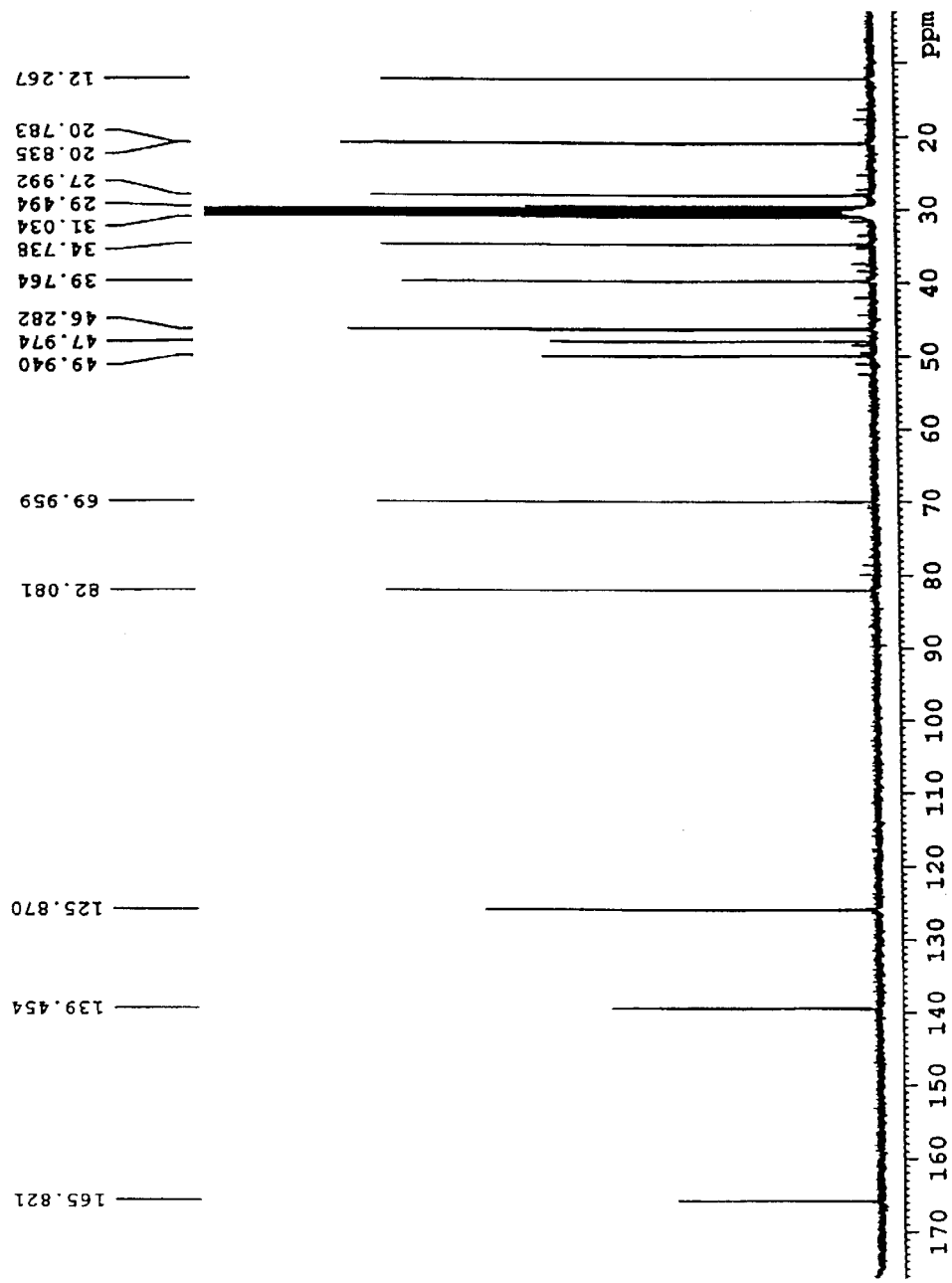
FIG. 1 shows a $^{13}$C-NMR spectrum analysis result for the ether dimer of isobornyl hydroxymethylacrylate prepared according to the present invention.

The Korean priority application Serial No. 98-58045 is incorporated by reference herein in its entirety.

The present invention provides a photosensitive polymer, preferably for use in a chemically modified resist composition, the polymer being represented by the following formula:

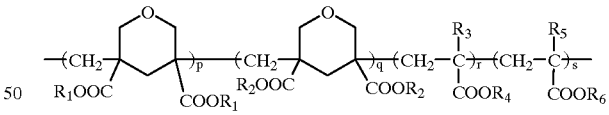

where $R_1$ is a $C_7$ to $C_{20}$ alicyclic aliphatic hydrocarbon compound, $R_2$ and $R_4$ independently represent a $C_1$ to $C_7$ alicyclic or aliphatic compound, $R_3$ and $R_5$ independently represent hydrogen or a methyl group, $R_6$ is hydrogen or a 2-hydroxyethyl group, $p/(p+q+r+s)$ is from 0.1 to about 0.5, $q/(p+q+r+s)$ is from 0.1 to about 0.5, $r/(p+q+r+s)$ is from 0.0 to about 0.5, and $s/(p+q+r+s)$ is from 0.01 to about 0.5.

The polymer preferably has a weight-average molecular weight of from about 5,000 to about 100,000. Preferably, $R_1$ is one selected from the group consisting of adamantyl, norbornyl and isobornyl groups. $R_2$ and $R_4$ preferably independently represent at least one selected from the group consisting of methyl, ethyl, t-butyl, tetrahydropyranyl and 1-alkoxyethyl groups, respectively, and more preferably 1-ethoxyethyl groups.

The present invention also provides a resist composition comprising (a) a photosensitive polymer preferably for use in a chemically amplified resist and represented by the following formula:

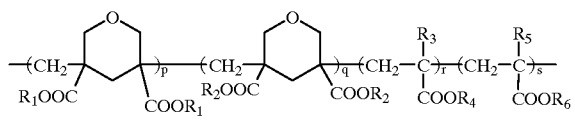

where $R_1$ is a $C_7$ to $C_{20}$ alicyclic aliphatic hydrocarbon compound, $R_2$ and $R_4$ independently represent $C_1$ to $C_7$ alicyclic aliphatic hydrocarbon, $R_3$ and $R_5$ independently represent hydrogen or methyl group, $R_6$ is hydrogen or 2-hydroxyethyl group, p/(p+q+r+s) is from 0.1 to about 0.5, q/(p+q+r+s) is from 0.1 to about 0.5, r/(p+q+r+s) is from 0.0 to about 0.5, and s/(p+q+r+s) is from 0.01 to about 0.5, and (b) a photoacid generator (PAG).

The resist composition contains an acid generating effective amount of the photoacid generator, and preferably, contains from 1 to about 15 weight percent of the photo acid generator based on the weight of the polymer.

The PAG can be any PAG known in the art, and preferably is one capable of generating an acid upon exposure to light. Preferably, the PAG is at least one compound selected from the group consisting of triarylsulfonium salts, diaryliodonium salts, sulfonates, and mixtures thereof. More preferably, the PAG is at least one compound selected from the group consisting of triphenylsulfonium triflate, triphenylsulfonium nonaflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, and mixtures thereof.

The resist composition may further comprise an organic base. Here, the resist composition usually comprises from 0.01 to about 2.0 weight percent of the organic base based on the weight of the polymer. The organic base preferably is at least one compound selected from the group consisting of triethyl amine, triisobutyl amine, triisooctyl amine, diethanol amine, triethanol amine, and mixtures thereof. In addition, the organic base may be at least one compound selected from the group consisting of diethanol amine, triethanol amine, and mixtures thereof.

The resist composition according to the present invention may further comprise a dissolution inhibitor. The dissolution inhibitor preferably is included in an amount of from 1 to about 30 weight percent based on the weight of the polymer. Preferably, the dissolution inhibitor is sarsasapogenin or t-butyl cholate.

Those skilled in the art are capable of formulating a suitable resist composition containing any of the aforementioned components, as well as other additives typically used in resist compositions, using the guidelines provided herein.

According to the present invention, there is provided a photosensitive polymer whose backbone has a cyclic structure and contains an alicyclic compound, thereby attaining resistance to dry etching. Also, since the structure of the polymer according to the present invention is based on an acrylate polymer, the transmittance of a resist composition containing the same can be improved. Thus, excellent lithographic performance can be obtained by using the resist composition obtained from the polymer.

Next, preferred embodiments of the present invention will be described in more detail with reference to preferred embodiments illustrated by the following examples.

EXAMPLE 1

Synthesis of ether dimer of adamantyl hydroxymethylacrylate

The synthesis reaction of ether dimer of adamantyl hydroxymethylacrylate is represented by the following reaction:

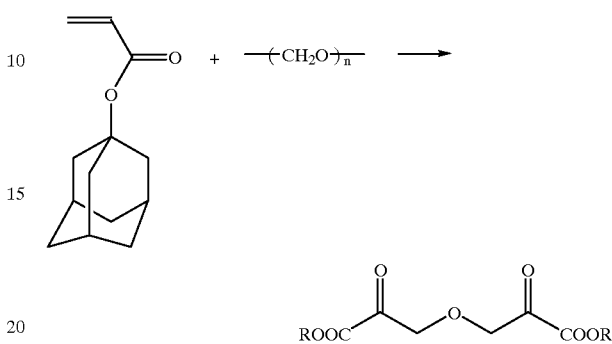

where R is adamantyl.

Adamantyl acrylate (ADA) (62 g: 0.3 mol), 9.0 g of paraformaldehyde (PFA) (0.3 mol) and 4.5 g of 1,4-diazabicyclo[2,2,2]octane (DABCO) were mixed in a round-bottom flask and 18.0 g of t-butanol was added. Then, the mixture was reacted at a temperature of 85° C. for about 6 days.

After the reaction was completed, the product was poured into excess methanol and stirred for 6 hours. Thereafter, the produced precipitate was filtered and dried to then recover a desired product (yield: 32%).

The result of nuclear magnetic resonance (NMR) analysis performed on the obtained product is as follows:

$^1$H-NMR (CDCl$_3$, ppm):
6.2(s, 1H), 5.8(s, 1H), 4.2(s, 1H), 2.2(s, 9H), 1.7(s, 6H)

EXAMPLE 2

Synthesis of ether dimer of isobornyl hydroxymethylacrylate

Isobornyl acrylate (IBA) (125 g: 0.6 mol), 18 g of paraformaldehyde (PFA) (0.6 mol) and 9.0 g of 1,4-diazabicyclo[2,2,2]octane (DABCO) were mixed in a round-bottom flask and 40 g of t-butanol was added. Then, the mixture was reacted at a temperature of 90° C. for about 6 days.

After the reaction was completed, the product was poured into excess water, neutralized using HCl and extracted using diethyl ether. The obtained extract was dried using MgSO$_4$.

After excess solvent was evaporated, a crude product was recrystallized using a n-hexane/methylene chloride solution to separate the product (yield: 65%).

The result of nuclear magnetic resonance (NMR) analysis performed on the obtained product is as follows:

$^1$H-NMR (acetone-d6, ppm):
6.2(s, 1H), 5.9(s, 1H), 4.7(t, 1H), 4.2(s, 2H), 1.8(m, 5H), 1.2(m, 2H), 1.1(s, 3H), 0.9(d, 6H)

$^{13}$C-NMR (acetone-d6, ppm):
166(C=O), 139(C=CH$_2$), 126(=CH$_2$), 82(OCH), 70(OCH$_2$) and 21(CH$_3$) Here, the result of $^{13}$C-NMR spectrum analysis is shown in FIG. 1.

EXAMPLE 3

Synthesis of ether dimer of t-butyl hydroxymethylacrylate

Tert-butyl acrylate (77 g: 0.6 mol), 18 g of paraformaldehyde (PFA) (0.6 mol) and 9.0 g of 1,4-diazabicyclo[2,2, 2]octane (DABCO) were mixed in a round-bottom flask and 40 g of tert-butanol was added. Then, the mixture was reacted at a temperature of 90° C. for about 6 days.

After the reaction was completed, toluene was added to the product and refluxed for 3 hours. Thereafter, the product was poured into excess water, neutralized using HCl and extracted using diethyl ether. Thereafter, the desired product was separated from the extract using column chromatography (hexane:diethyl ether=9:1) (yield: 65%).

The results of Fourier Transform Infrared (FT-IR) analysis and nuclear magnetic resonance (NMR) analysis performed on the product are as follows:

FT-IR(NaCl, cm$^{-1}$): 2979(C-H, t-butyl), 1710(C=O, ester), 1639(C=H, vinyl), 1369, 1154

$^1$H-NMR (acetone-d6, ppm): 6.2(s, 1H), 5.8(s, 1H), 4.2(s, 2H), 1.5(s, 9H)

Figure 2:
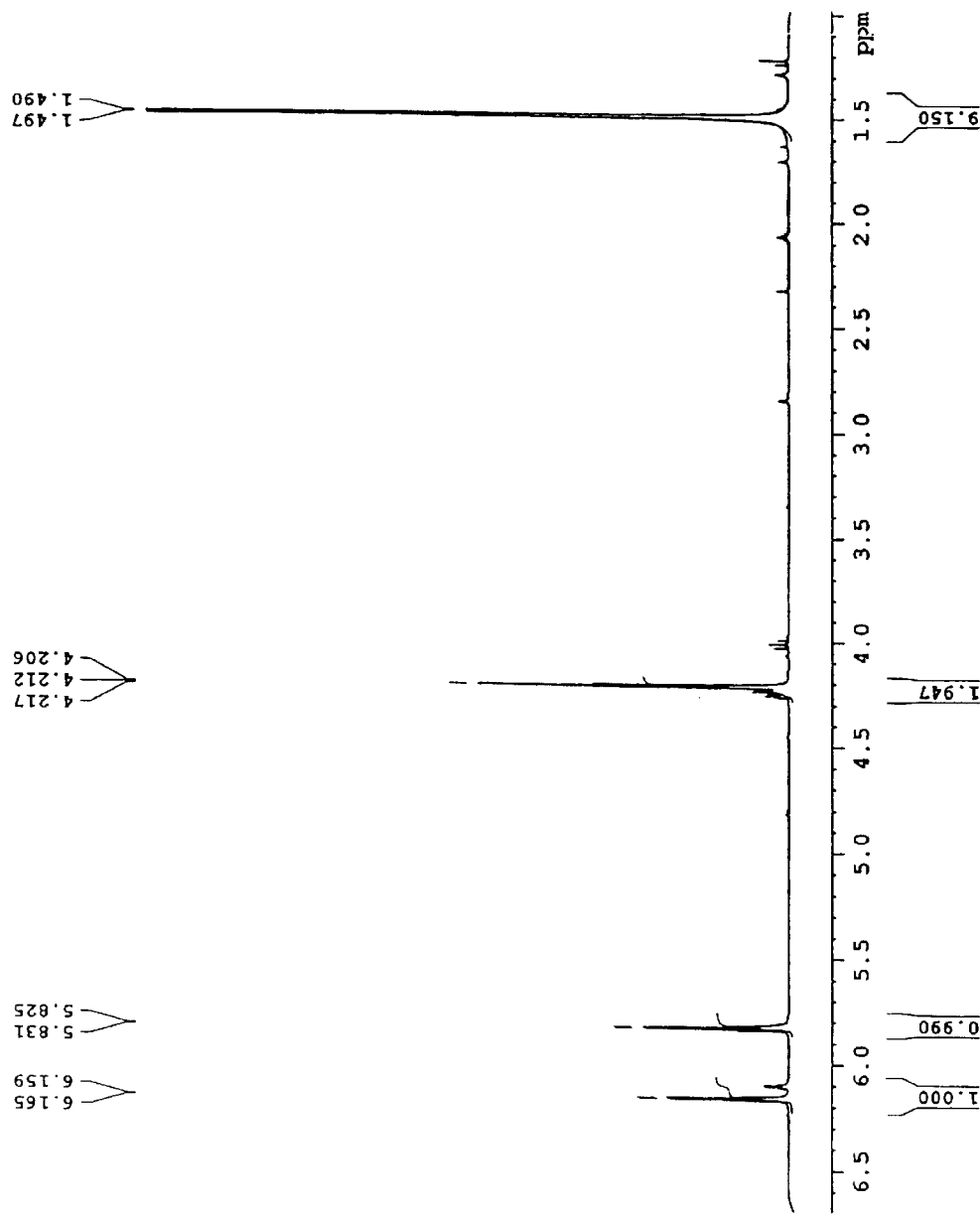
FIG. 2 shows a $^1$H-NMR spectrum analysis result for the ether dimer of t-butyl hydroxymethylacrylate prepared according to the present invention.

Here, the result of $^1$H-NMR spectrum analysis is shown in FIG. 2.

EXAMPLE 4

Synthesis of ether dimer of 1-ethoxyethyl hydroxymethyl acrylate 1-ethoxyethyl acrylate (87 g: 0.6 mol), 18.0 g of paraformaldehyde (PFA) (0.6 mol) and 9.0 g of 1,4-diazabicyclo[2,2,2]octane (DABCO) were mixed in a round-bottom flask, 36 g of t-butanol was added to the obtained mixture and reacted at a temperature of 90° C. for about 6 days.

After the reaction was completed, toluene was added to the reactant and refluxed for 3 hours. Thereafter, the product was poured into excess water, neutralized using HCl and extracted using diethyl ether. The obtained extract was dried using MgSO$_4$.

After excess solvent was evaporated, a crude product was recrystallized using a n-hexane solution to separate the product (yield: 60%).

EXAMPLE 5

Synthesis of copolymer of ether dimer

The synthesis reaction of a copolymer according to this embodiment can be represented by the following formula:

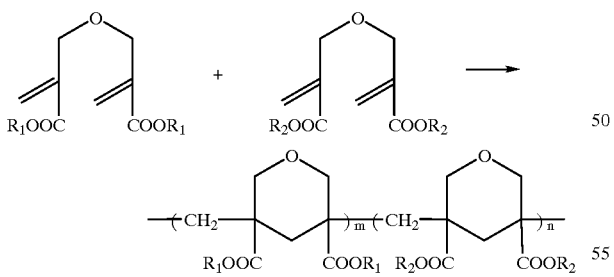

where R$_1$ is adamantyl and R$_2$ is t-butyl.

The ether dimer (4.5 g: 10 mmol) synthesized in Example 1, 3.0 g of the ether dimer (10 mmol) synthesized in Example 3 and 0.3 g of azobis(isobutyronitrile) (AIBN) were dissolved in 65 ml of anhydrous benzene, and purged for about 2 hours using N$_2$ gas. Then, the obtained product was polymerized at a temperature of 65° C. for about 48 hours.

After the polymerization was completed, the product was slowly dropped into excess methanol (10 fold) to be precipitated. The precipitate was dried in a vacuum oven maintained at about 50° C. for about 24 hours (yield: 70%).

The weight-average molecular weight and polydispersity of the obtained product were 13,400 and 2.4, respectively.

EXAMPLE 6

Synthesis of copolymer of ether dimer

The synthesis reaction of a copolymer according to this embodiment can be represented by the formula expressed in Example 5, in which R$_1$ is adamantyl and R$_2$ is 1-ethoxy ethyl.

The ether dimer (4.5 g: 10 mmol) synthesized in Example 1, 3.3 g of the ether dimer (10 mmol) synthesized in Example 4 and 0.3 g of AIBN were dissolved in 65 ml of anhydrous benzene, and purged for about 2 hours using N$_2$ gas. Then, the obtained product was polymerized at a temperature of 65° C. for about 48 hours.

After the polymerization was completed, the product was slowly dropped into excess n-hexane (10 fold) to be precipitated. The obtained precipitate was dried in a vacuum oven maintained at a temperature of 50° C. for about 24 hours (yield: 73%).

The weight-average molecular weight and polydispersity of the obtained material were 14,500 and 2.5, respectively.

EXAMPLE 7

Synthesis of copolymer of ether dimer

The synthesis reaction of a copolymer according to this embodiment can be represented by the formula expressed in Example 5, in which R$_1$ is isobornyl and R$_2$ is 1-ethoxy ethyl.

The ether dimer (4.6 g: 10 mmol) synthesized in Example 2, 3.3 g of the ether dimer (10 mmol) synthesized in Example 4 and 0.3 g of AIBN were dissolved in 65 ml of anhydrous benzene, and then a polymer was prepared in the same manner as that of the Example 6 (yield: 70%).

The weight-average molecular weight and polydispersity of the obtained material were 13,600 and 2.4, respectively.

EXAMPLE 8

Synthesis of terpolymer

The synthesis reaction of a terpolymer according to this embodiment can be represented by the following reaction:

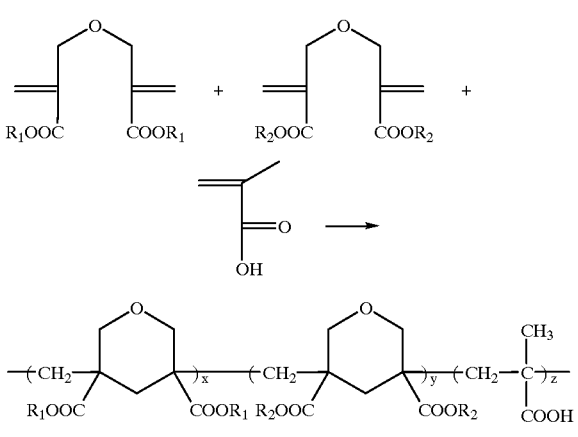

where R$_1$ is adamantyl and R$_2$ is 1-ethoxy ethyl.

The ether dimer (8.2 g: 40 nmmol) synthesized in Example 1, 10 g of the ether dimer (30 mmol) synthesized in Example 4, 2.6 g of methacrylic acid (30 mmol) and 1.3 g of AIBN were dissolved in 240 mnl of anhydrous tetrahydrofuran (THF), purged for about 2 hours using $N_2$ gas, and polymerized for about 24 hours in a reflux state.

After the polymerization was completed, the product was slowly dropped into excess n-hexane to be precipitated. The precipitate was filtered using a glass filter. Thereafter, the filtered material was dissolved again in THF, reprecipitated in n-hexane to filter the precipitate and then dried in a vacuum oven maintained at about 50° C. for about 24 hours (yield: 65%).

The weight-average molecular weight and polydispersity of the obtained product were 15,400 and 2.4, respectively.

EXAMPLE 9

Synthesis of terpolymer

The synthesis reaction of a terpolymer according to this embodiment can be represented by the formula expressed in Example 8, in which $R_1$ is isobornyl and $R_2$ is 1-ethoxy ethyl.

The ether dimer (18.4 g: 40 mmol) synthesized in Example 2, 10 g of the ether dimer (30 mmol) synthesized in Example 4, 2.2 g of acrylic acid (30 mmol) and 1.3 g of AIBN were dissolved in 240 ml of THF. Then, a polymer was prepared in the same manner as that of the Example 8 (yield: 68%).

The weight-average molecular weight and polydispersity of the obtained material were 14,400 and 2.4, respectively.

EXAMPLE 10

Synthesis of terpolymer

The synthesis reaction of a terpolymer according to this embodiment can be represented by the following reaction:

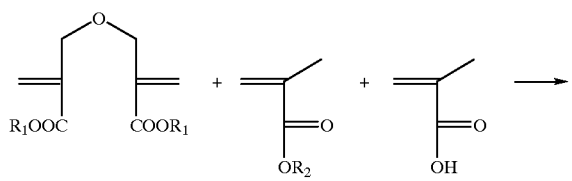

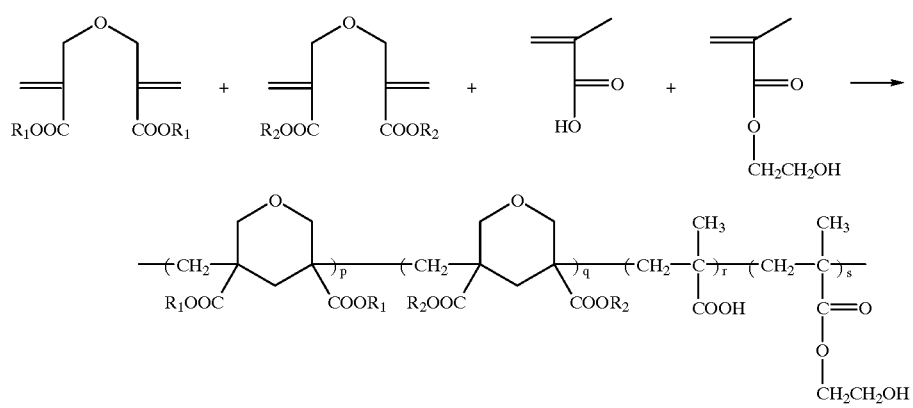

where $R_1$ is isobornyl and $R_2$ is t-butyl.

The ether dimer (18.2 g: 40 mmol) synthesized in Example 2, 3.6 g of t-butyl methacrylate (25 mmol), 3.0 g of methacrylic acid (35 mmol) and 1.3 g of AIBN were dissolved in 200 ml of tetrahydrofuran (THF), purged for about 2 hours using $N_2$ gas, and polymerized for about 24 hours in a reflux state.

After the polymerization was completed, the product was slowly dropped into excess n-hexane to be precipitated. The precipitate was filtered using a glass filter. Thereafter, the filtered material was dissolved again in THF, reprecipitated in n-hexane to filter the precipitate and then dried in a vacuum oven maintained at about 50° C. for about 24 hours (yield: 65%).

The weight-average molecular weight and polydispersity of the obtained product were 13,700 and 2.2, respectively.

EXAMPLE 11

Synthesis of terpolymer

The synthesis reaction of a terpolymer according to this embodiment can be represented by the above formula expressed in Example 10, in which $R_1$ is isobornyl and $R_2$ is tetrahydropyranyl.

A polymer was prepared in the same manner as that of Example 10 using 18.2 g of ether dimer (40 mmol) synthesized in Example 2, 5.1 g of tetrahydropyranyl methacrylate (30 mmol) and 2.6 g of methacrylic acid (30 mmol) (yield: 70%).

The weight-average molecular weight and polydispersity of the obtained product were 13,400 and 2.4, respectively.

Figure 3:
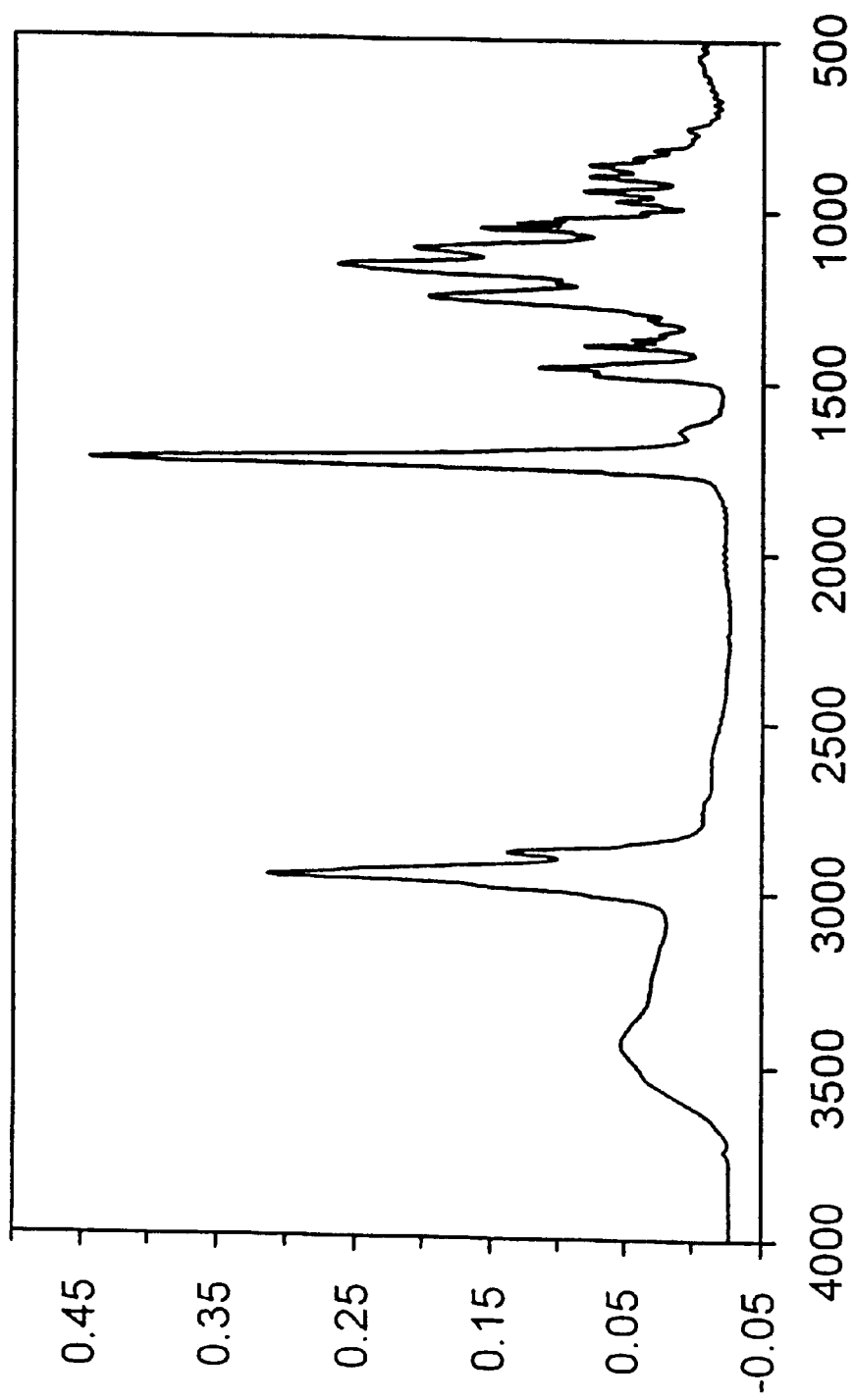
FIG. 3 shows a FT-IR spectrum analysis result for a terpolymer prepared according to the present invention.

The FT-IR spectrum (HBr) for the obtained product is shown in FIG. 3.

EXAMPLE 12

Synthesis of tetrapolymer

The synthesis reaction of a tetrapolymer according to this embodiment can be represented by the following reaction: where $R_1$ is isobornyl and $R_2$ is 1-ethoxy ethyl.

The ether dimer (14 g: 30 mmol) synthesized in Example 2, 10 g of the ether dimer (30 mmol) synthesized in Example 4, 1.7 g of methacrylic acid (20 mmol), 2.7 g of 2-hydroxyethyl methacrylate (20 mmol) and 1.3 g of AIBN were dissolved in 220 ml of THF, purged for about 2 hours using $N_2$ gas, and polymerized for about 24 hours in a reflux state.

After the polymerization was completed, the product was slowly dropped into excess n-hexane to be precipitated. The precipitate was filtered using a glass filter. Thereafter, the filtered material was dissolved again in THF, reprecipitated in n-hexane to filter the precipitate and then dried in a vacuum oven maintained at about 50° C. for about 24 hours (yield: 70%).

The weight-average molecular weight and polydispersity of the obtained product were 12,600 and 2.2, respectively.

EXAMPLE 13

Resist composition

The copolymer (1.0 g) synthesized in Example 5 [m/(m+n)=0.5 and weight-average molecular weight=13,400], and 0.03 g of triphenyl sulfonium triflate as a photoacid generator were completely dissolved in 7.0 g of propylene glycol monomethyl ether acetate (PGMEA). The solution was filtered using a 0.2 μm membrane filter to obtain a resist composition. Then, the resist composition was coated on a silicon wafer treated with hexamethyldisilazane (HMDS) to a thickness of about 0.45 μm.

The wafer having the resist composition coated thereon was pre-baked at a temperature of about 130° C. for about 90 seconds and exposed to light using a KrF excimer laser having a numerical aperture of 0.45. Then, post-exposure baking (PEB) was performed at a temperature of about 140° C. for about 90 seconds.

The resultant resist material was developed using a mixed solution of 25 wt % of isopropyl alcohol (IPA) and 2.38 wt % of tetramethylammonium hydroxide (TMAH) solution.

EXAMPLE 14

Resist composition

The copolymer (1.0 g) synthesized in Example 7 [m/(m+n)=0.5 and weight-average molecular weight=13,600], and 0.03 g of triphenyl sulfonium triflate as a photoacid generator were completely dissolved in 7.0 g of propylene glycol monomethyl ether acetate (PGMEA). The solution was filtered using a 0.2 μm membrane filter to obtain a resist composition. Then, the resist composition was coated on a silicon wafer treated with hexamethyldisilazane (HMDS) to a thickness of about 0.45 μm.

The wafer having the resist composition coated thereon was pre-baked at a temperature of about 130° C. for about 90 seconds and exposed to light using a KrF excimer laser having a numerical aperture of 0.45. Then, post-exposure baking (PEB) was performed at a temperature of about 140° C. for about 90 seconds.

The resultant resist material was developed using a mixed solution of 20 wt% of isopropyl alcohol (IPA) and 2.38 wt % of tetramethylammonium hydroxide (TMAH) solution.

EXAMPLE 15

Resist composition

The terpolymer (1.0 g) synthesized in Example 8 [x/(x+y+z)=0.4, y/(x+y+z)=0.3 and weight-average molecular weight 15,400], 0.02 g of triphenyl sulfonium triflate as a photoacid generator and 2 mg of triisobutyl amine were completely dissolved in 7.0 g of PGMEA. The solution was filtered using a 0.2 μm membrane filter to obtain a resist composition. Then, the resist composition was coated on a silicon wafer treated with HMDS to a thickness of about 0.45 μm.

The wafer having the resist composition coated thereon was pre-baked at a temperature of about 110° C. for about 90 seconds and exposed to light using an ArF excimer laser having a numerical aperture of 0.6. Then, post-exposure baking (PEB) was performed at a temperature of about 120° C. for about 90 seconds.

The resultant resist material was developed using 2.38 wt % of TMAH solution. As a result, when an exposure dose was about 17 mJ/cm$^2$, it was observed that a clean 0.30 μm line and space pattern was obtained.

EXAMPLE 16

Resist composition

The terpolymer (1.0 g) synthesized in Example 9 [x/(x+y+z)=0.4, y/(x+y+z)=0.3 and weight-average molecular weight=14,400], 0.01 g of triphenyl sulfonium triflate as a photoacid generator and 0.01 g of N-hydroxysuccinimide triflate were completely dissolved in 7.0 g of PGMEA. The obtained solution was completely dissolved in 2 mg of triisobutyl amine a an organic base and then filtered using a 0.2 μm membrane filter to obtain a resist composition. Then, the resist composition was coated on a silicon wafer treated with HMDS to a thickness of about 0.45 μ.

The wafer having the resist composition coated thereon was pre-baked at a temperature of about 110° C. for about 90 seconds and exposed to light using an ArF excimer laser having a numerical aperture of 0.6. Then, post-exposure baking (PEB) was performed at a temperature of about 120° C. for about 90 seconds.

The resultant resist material was developed using 2.38 wt % of TMAH solution. As a result, when an exposure dose was about 21 mJ/cm$^2$, it was observed that a clean 0.30 μm line and space pattern was obtained.

EXAMPLE 17

Resist composition

The terpolymer (1.0 g) synthesized in Example 10 [x/(x+y+z)=0.40, y/(x+y+z)=0.25 and weight-average molecular weight=13,700], 0.01 g of triphenyl sulfonium triflate and 0.02 g of N-hydroxysuccinimide triflate as photoacid generators were completely dissolved in 7.0 g of PGMEA. The obtained solution was completely dissolved in 3 mg of triethanol amine as an organic base and then filtered using a 0.2 μm membrane filter to obtain a resist composition. Then, the resist composition was coated on a silicon wafer treated with HMDS to a thickness of about 0.45 μm.

The wafer having the resist composition coated thereon was pre-baked at a temperature of about 130° C. for about 90 seconds and exposed to light using an ArF excimer laser having a numerical aperture of 0.6. Then, post-exposure baking (PEB) was performed at a temperature of about 140° C. for about 90 seconds.

The resultant resist material was developed using 2.38 wt % of TMAH solution. As a result, when an exposure dose was about 23 mJ/cm$^2$, it was observed that a clean 0.30 μm line and space pattern was obtained.

EXAMPLE 18

Resist composition

The terpolymer (1.0 g) synthesized in Example 11 [x/(x+y+z)=0.40, y/(x+y+z)=0.30 and weight-average molecular weight=13,400], 0.02 g of triphenyl sulfonium triflate as a photoacid generator and 2 mg of triethanol amine as an organic base were completely dissolved in 7.0 g of PGMEA. The obtained solution was filtered using a 0.2 μm membrane filter to obtain a resist composition. Then, the resist composition was coated on a silicon wafer treated with HMDS to a thickness of about 0.45 μm.

The wafer having the resist composition coated thereon was pre-baked at a temperature of about 100° C. for about 90 seconds and exposed to light using an ArF excimer laser having a numerical aperture of 0.6. Then, post-exposure baking (PEB) was performed at a temperature of about 110° C. for about 90 seconds.

The resultant resist material was developed using 2.38 wt % of TMAH solution for about 60 seconds. As a result, when an exposure dose was about 16 mJ/cm$^2$, it was observed that a clean 0.30 μm line and space pattern was obtained.

EXAMPLE 19

Resist composition

The terpolymer (1.0 g) synthesized in Example 11 [x/(x+y+z)=0.40, y/(x+y+z)=0.30 and weight-average molecular weight=13,400], 0.02 g of triphenyl sulfonium nonaflate as a photoacid generator and 2 mg of triisobutyl amine as an organic base were completely dissolved in 7.0 g of PGMEA. Then, the same process as that of Example 18 was performed. As a result, when an exposure dose was about 18 mJ/cm$^2$, it was observed that a clean 0.30 μm line and space pattern was obtained.

EXAMPLE 20

Resist composition

The tetrapolymer (1.0 g) synthesized in Example 12 [p/(p+q+r+s)=0.30, q/(p+q+r+s)=0.30, r/(p+q+r+s)=0.20 and weight-average molecular weight=12,600], 0.02 g of triphenyl sulfonium triflate as a photoacid generator and 2 mg of triethanol amine as an organic base were completely dissolved in 7.0 g of PGMEA. The obtained solution was filtered using a 0.2 μm membrane filter to obtain a resist composition. Then, the resist composition was coated on a silicon wafer treated with HMDS to a thickness of about 0.45 μm.

The wafer having the resist composition coated thereon was pre-baked at a temperature of about 110° C. for about 90 seconds and exposed to light using an ArF excimer laser having a numerical aperture of 0.6. Then, post-exposure baking (PEB) was performed at a temperature of about 120° C. for about 90 seconds.

The resultant resist material was developed using 2.38 wt % of TMAH solution for about 60 seconds. As a result, when an exposure dose was about 17 mJ/cm$^2$, it was observed that a clean 0.30 μm line and space pattern was obtained.

As described above, according to the present invention, by providing a photosensitive polymer whose backbone has a cyclic structure and contains an alicyclic compound, sufficiently increased dry etching resistance of a resist composition containing the polymer can be obtained. Also, since the polymer according to the present invention has a basic structure of acrylate polymer, a high transmittance can be provided by the resist composition comprising the polymer. The photosensitive polymer preferably is obtained by copolymerizing ether dimer of hydroxymethyl acrylate derivatives. Excellent lithographic performance can be obtained using the resist composition obtained from the polymer. Therefore, the resist composition according to the present invention can be useful in the manufacture of next generation semiconductor devices.

Although the present invention has been described in detail through preferred embodiments, the invention is not limited thereto, and various modifications and alterations within the spirit and scope of the invention are possible by those skilled in the art.

We claim:

1. A photosensitive polymer represented by the following formula:

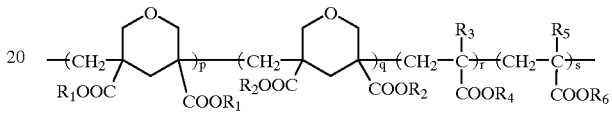

where $R_1$ is a $C_7$ to $C_{20}$ alicyclic compound, $R_2$ and $R_4$ independently represent a $C_1$ to $C_7$ aliphatic or alicyclic compound, $R_3$ and $R_5$ independently represent hydrogen or methyl group, $R_6$ is hydrogen or 2-hydroxyethyl group, p/(p+q+r+s) is from 0.1 to about 0.5, q/(p+q+r+s) is from 0.1 to about 0.5, r/(p+q+r+s) is from 0.0 to about 0.5, and s/(p+q+r+s) is from 0.01 to about 0.5, wherein p+q+r+s=1.0.

2. The photosensitive polymer according to claim 1, wherein the polymer has a weight-average molecular weight of from about 5,000 to about 100,000.

3. The photosensitive polymer according to claim 1, wherein $R_1$ is at least one selected from the group consisting of adamantyl, norbonyl and isobornyl groups.

4. The photosensitive polymer according to claim 1, wherein $R_2$ and $R_4$ independently represent at least one selected from the group consisting of methyl, ethyl, t-butyl, tetrahydropyranyl and 1-alkoxyethyl groups.

5. The photosensitive polymer according to claim 1, wherein $R_2$ and $R_4$ independently represent 1-ethoxyethyl group.

6. A resist composition comprising:
   (a) a photosensitive polymer represented by the following formula:

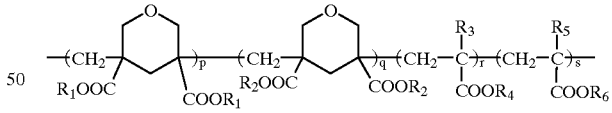

where $R_1$ is a $C_7$ to $C_{20}$ alicyclic compound, $R_2$ and $R_4$ independently represent a $C_1$ to $C_7$ aliphatic or alicyclic compound, $R_3$ and $R_5$ independently represent hydrogen or methyl group, $R_6$ is hydrogen or 2-hydroxyethyl group, p/(p+q+r+s) is from 0.1 to about 0.5, q/(p+q+r+s) is from 0.1 to about 0.5, r/(p+q+r+s) is from 0.0 to about 0.5, and s/(p+q+r+s) is from 0.01 to about 0.5, wherein p+q+r+s=1.0, and
   (b) a photoacid generator (PAG).

7. The resist composition according to claim 6, wherein the polymer has a weight-average molecular weight of from about 5,000 to about 100,000.

8. The resist composition according to claim 6, wherein $R_1$ is at least one selected from the group consisting of adamantyl, norbonyl and isobornyl groups.

9. The resist composition according to claim 6, wherein $R_2$ and $R_4$ independently represent at least one selected from the group consisting of methyl, ethyl, t-butyl, tetrahydropyranyl and 1-alkoxyethyl groups.

10. The resist composition according to claim 6, wherein $R_2$ and $R_4$ independently represent 1-ethoxyethyl group.

11. The resist composition according to claim 6, wherein the photoacid generator is present in an amount of from 1 to about 15 weight percent based on the weight of the polymer.

12. The resist composition according to claim 6, wherein the PAG is at least one compound selected from the group consisting of triarylsulfonium salts, diaryliodonium salts, sulfonates, and mixtures thereof.

13. The resist composition according to claim 6, wherein the PAG is at least one compound selected from the group consisting of triphenylsulfonium triflate, triphenylsulfonium nonaflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(allylsulfonates), N-hydroxy succinimide triflate, and mixtures thereof.

14. The resist composition according to claim 6, further comprising an organic base.

15. The resist composition according to claim 14, wherein the organic base is present in an amount of from 0.01 to about 2.0 weight percent based on the weight of the polymer.

16. The resist composition according to claim 14, wherein the organic base is at least one compound selected from the group consisting of triethyl amine, triisobutylamine, triisooctylamine, diethanol amine, triethanol amine, and mixtures thereof.

17. The resist composition according to claim 6, further comprising a dissolution inhibitor.

18. The resist composition according to claim 17, wherein the dissolution inhibitor is present in an amount of from 1 to about 30 weight percent based on the weight of the polymer.

19. The resist composition according to claim 17, wherein the dissolution inhibitor is sarsasapogenin or t-butyl cholate.

* * * * *